United States Patent [19]

Matsuoka et al.

[11] Patent Number: 5,000,696
[45] Date of Patent: Mar. 19, 1991

[54] LOCK MECHANISM IN AN IC SOCKET

[75] Inventors: Noriyuki Matsuoka; Yoshiyuki Kato; Kazumi Uratsuji, all of Tokyo, Japan

[73] Assignee: Yamaichi Electric Mfg. Co., Ltd., Tokyo, Japan

[21] Appl. No.: 389,899

[22] Filed: Aug. 4, 1989

[30] Foreign Application Priority Data

Aug. 4, 1988 [JP] Japan .................................. 63-195413

[51] Int. Cl.⁵ ........................................... H01R 13/62
[52] U.S. Cl. ..................................... 439/331; 439/330
[58] Field of Search ...................... 439/70, 71, 72, 73, 439/330, 331, 372; 220/315, 324, 334

[56] References Cited

U.S. PATENT DOCUMENTS

| | | | |
|---|---|---|---|
| 3,391,383 | 7/1968 | Antes | 439/331 |
| 4,220,383 | 9/1980 | Scheingold et al. | 439/71 |
| 4,515,424 | 5/1985 | Sakurai | 439/331 X |
| 4,657,328 | 4/1987 | Matsuoka | 439/331 |
| 4,717,346 | 1/1988 | Yoshizaki | 439/331 X |
| 4,783,321 | 11/1988 | Spence | 220/324 X |
| 4,786,256 | 11/1988 | Angeleri et al. | 439/330 X |

Primary Examiner—Neil Abrams
Assistant Examiner—Khiem Nguyen
Attorney, Agent, or Firm—Wenderoth, Lind & Ponack

[57] ABSTRACT

A lock mechanism in an IC socket in which a socket substrate including an IC press cover is pivotally attached at one end thereof with a lock lever resiliently supported in such a manner as to be biased in a retaining direction. The lock lever is engaged in one end of the IC press cover by biasing the lock lever foward under a resilient supporting force. The engagement is released by pivoting the lock lever rearward against the resilient supporting force. The lock lever is provided with a hook portion extending from a pivotally supported portion of the lock lever and adapted to engage with and disengage from the end portion of the IC press cover, and a push-down operating portion projecting rearward of the hook portion from the pivotally supported portion. The push-down operating portion projects rearwardly of an end face of the socket substrate.

4 Claims, 4 Drawing Sheets

LOCK MECHANISM IN AN IC SOCKET

BACKGROUND OF THE INVENTION

1. Field of the Invention

This invention relates to a lock mechanism in an IC socket which includes an IC press cover to be closed over a socket substrate and a lock lever for holding the IC press cover in its closed state.

2. Brief Description of the Prior Art

In a conventional IC socket comprising a socket substrate and an IC package placed on the socket substrate and in which a contact relation between the socket substrate and the IC package is obtained by exerting a force directed downward on the IC package, the socket substrate, for example, is provided with an IC cover pivotally attached to one end of the socket substrate and a lock lever pivotally attached to the other end thereof. The lock lever is brought into engagement with one end of the IC press cover closed over the socket substrate to maintain its closed state by pivoting the lock lever forwardly. The lock lever is provided with an operating portion projecting from the vicinity of a free end of the lock lever in a forward direction or along an upper surface of the socket substrate. The lock lever can be pivoted rearwardly so as to be disengaged from the IC press cover.

The lock lever is normally resiliently supported by a spring in the direction of engagement (in the direction where the lock lever pivots forwardly) and the engagement between the lock lever and the IC press cover is released by a rearward pivoting of the lock lever against the resilient force of the spring.

When a number of IC sockets are arranged in parallel rows on a wire board, if the operation portions of the lock levers project from the upper surfaces of the socket substrates, large spaces must be provided between the adjacent substrates, thus giving rise to a problem in that in a burn-in test for carrying out a large number of measurements of IC at a time, for example, accommodation capacity in a furnace of a constant temperature is jeopardized.

Recently, a method has been adopted in which the lock levers of a large number of IC sockets arranged on the wire board are all disengaged at the same time by a robot arm. However, because the operating portion projects upward from the socket substrate, the robot arm must be moved horizontally along the upper surface of the socket substrate in order to exert a force on the operating portion. In this case, a complicated control is required in which the robot arm waiting in an upper position is first lowered and then moved in the horizontal direction. Furthermore, when an obstacle exists on the upper surface of the socket substrate, the automatic disengagement mentioned above becomes difficult.

The projection of the operating portion along the upper surfaces of the socket substrate and the IC press cover is an obstacle in obtaining a sufficient pivoting of the operating portion and the lock lever so much so that an insufficient engagement, etc. may occur. Moreover, it is difficult to adopt a method in which the robot arm can be merely lowered in order to release the engagement.

The present invention has been accomplished in order to overcome the above-mentioned problems.

SUMMARY OF THE INVENTION

It is therefore a primary object of the present invention to provide a lock mechanism in an IC socket, in which the engagement and disengagement operation of a lock lever can be performed by the lowering of a robot arm with high reliability and with ease, and a group of lock levers of a number of IC sockets arranged on a wire board can easily be disengaged all at one time.

As means for solving the above problems, the lock lever is provided with a hook portion extending from a pivotally supported portion in order to be engaged with an IC press cover, said pivotally supported portion being provided with a push-down operating portion projecting rearward therefrom, said push-down operating portion being arranged in such a manner as to project rearwardly of an end face of a socket substrate.

According to the present invention, the hook portion and the push-down portion form a generally L-shaped lever member in which the pivotally supported portion serves as a mounting point. The push-down operating portion is arranged in such a manner as to project rearward of the end face of the socket substrate. When the push-down operating portion is pushed down by lowering the robot arm along the rear surface of the hook portion, the operating portion is pivoted downward and the hook portion is pivoted rearward to effect the disengagement. When the push-down operating portion is pushed down, the lever is activated and the hook portion is pivoted rearward with little force to effect the disengagement.

Accordingly, the disengagement can be effected by lowering the robot arm at a portion where it does not interfere with the socket substrate and IC press cover.

Also, when a number of IC sockets are arranged in parallel on a wire board, the push-down operating portions projecting rearward of the end faces of the socket substrates, are arranged in several rows. By lowering the robot arm onto the line between the rows of the operating portions to push down all of the operating portions, disengagement can be effected all at one time.

The above and other objects and features of the present invention will be apparent from the following detailed description and appended claims when taken with the accompanying drawings.

DETAILED DESCRIPTION OF THE PREFERRED EMBODIMENTS

Figure 1:
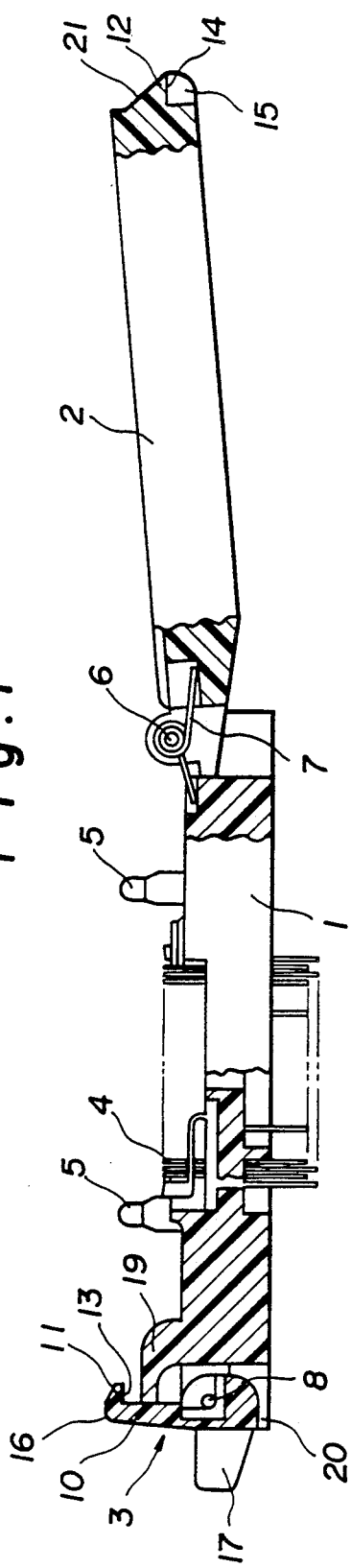
FIG. 1 is a side view, partly in section, of an embodiment of an IC socket according to the present invention.

The embodiments of the present invention will be described hereunder with reference to FIGS. 1 through 7 of the accompanying drawings.

In the figures, reference numeral 1 denotes a socket substrate, 2 an IC press cover, and 3 a lock lever.

The socket substrate 1 is provided with a number of contacts 4 arranged at its central upper surface and a plurality of positioning pins 5 extending from a location peripheral to that where the contacts 4 are arranged. By virtue of the foregoing arrangement, when an IC package is placed on the socket substrate 1, the positioning pins 5 are inserted into corresponding positioning holes formed in the IC package so as to obtain an accurate contact relation. Each of the positioning pins 5 is of a two-step shaft type having a small diameter portion at its free end and a large diameter portion at its other end. By virtue of the foregoing arrangement, the small diameter portion of the positioning pin 5 facilitates an easy insertion and removal thereof into and from the positioning hole formed in the IC package (not shown) and the large diameter portion of the positioning pin 5 facilitates an accurate alignment with respect to the positioning hole of the IC package. As a result, the IC package and the contacts can correctly be positioned to obtain a reliable contact relation.

Figure 2:
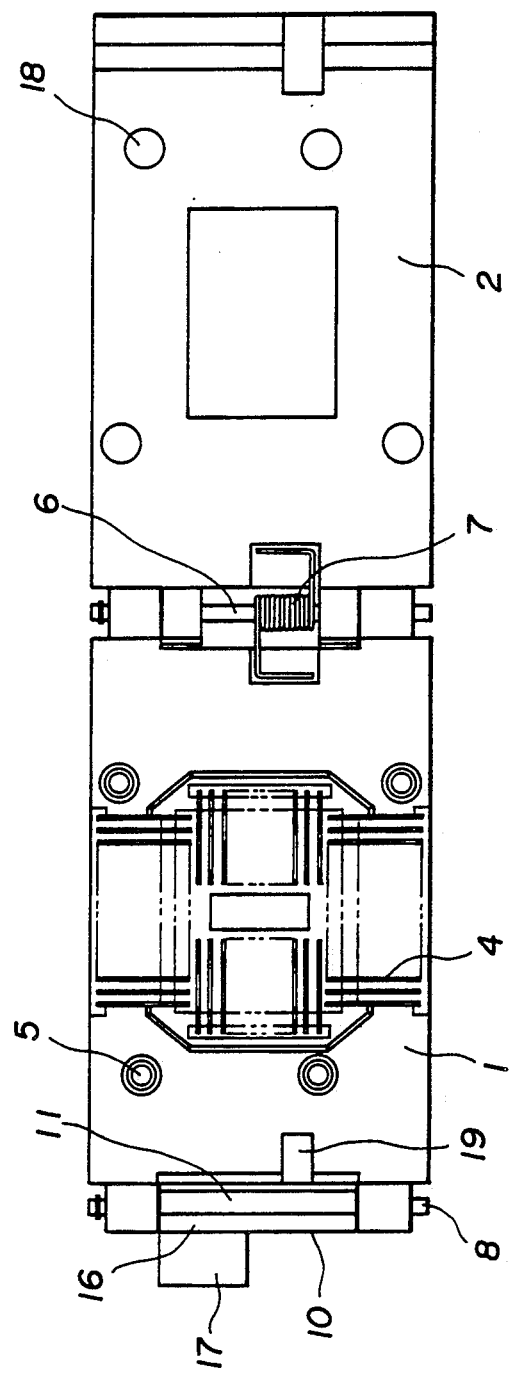
FIG. 2 is a plan view thereof.

Furthermore, as shown in FIGS. 1 through 3, the socket substrate 1 is provided with the IC press cover 2 pivotally attached to one end of the socket substrate 1 through a shaft 6. The IC press cover 2 is normally resiliently supported in the direction of opening the IC press cover 2 by a spring 7 mounted on the shaft portion. By closing the IC press cover 2 onto the socket substrate 1 against the force of the spring 7, the IC (IC body or IC contacting piece) is urged against the contacts so as to obtain a resilient contact relation with the contacts. The IC press cover 2 is formed with inserting holes 18 for permitting the positioning pins 5 to be inserted therein when the IC press cover 2 is closed.

Further, as shown in FIGS. 1 through 3, the socket substrate 1 is provided with a lock lever 3 pivotally attached to the other end of the socket substrate 1 through a shaft 8. The lock lever 3 is resiliently supported by a spring 9 mounted on the shaft 8 and biases the IC press cover 2 toward engagement with the spring 9. Pivotal movement of the lock lever 3 in the forward direction according to the resilient force of the spring 9, brings the lock lever 3 into engagement with the free end portion of the IC press cover 2, whereas a pivotal movement of the lock lever 3 in the backward direction against the force of the spring disengages the lock lever 3 from the IC press cover 2.

The lock lever 3 is provided with a hook portion 10 protruding from one end portion of the socket substrate 1, the hook portion 10 being provided with a retaining claw 11 projecting from a front surface of the free end of the hook portion 10. The IC press cover 2 is provided with a retaining step portion 12 at its free end, the retaining step portion 12 being engaged with the retaining claw 11 to maintain a closed state of the IC press cover 2 with respect to the socket substrate 1. In this case, of the engaging surface 13 of the engaging claw 11 and the engaging surface 14 of the retaining step portion 12, at least the engaging surface 14 is inclined downward in an indented direction, i.e., in the engaging direction (inclined upward in the disengaging direction) so as to effectively obtain an engagement between the engaging claw 11 and the retaining step portion 12 which pivot along circular orbits.

Also, the retaining step portion 12 has a retaining groove 15 extending below the upper surface of the IC press cover 2. On the other hand, the free end of the hook portion 10 does not extend beyond the upper surface of the IC press cover 2, and the engaging claw 11 and the retaining step portion 12 are engaged with each other within the retaining groove 15 so that the free end of the hook portion 10 does not project from the upper surface of the IC press cover 2.

Furthermore, the hook portion 10 is provided at a rear surface of its free end with a cam face 16 adapted to be slid by the robot arm when the engagement of the lock lever 3 is insufficient. That is, the IC press cover 2 is normally resiliently supported by the spring 7 in the opening direction. Furthermore, the IC press cover 2 is subjected to a push-up force by the contacts 4. As the retaining claw 11 of the hook portion 10 must be engaged with the retaining step portion 12 against this push-up force, the engagement becomes insufficient; in other words, the retaining claw 11 is not deeply engaged with the retaining step portion 12. Accordingly, the IC press cover 2 is not completely pushed down, thus resulting in an insufficient engagement. Therefore, a situation can arise wherein no sufficient contacting pressure can be obtained between the IC and the contact. When such an insufficient engagement occurs, the cam face 16 is situated along a downwardly extending orbit of the robot arm. According to the lowering movement of the robot arm, the robot arm urges the cam face while sliding thereon. As a result, the lowering force of the robot arm is converted to a rotational force of the hook portion in the forward direction. As a result, the engaging claw 11 is fully engaged with the retaining step portion 12 to a predetermined extent.

The lock lever 3 is provided with a push-down operating portion 17 projecting, from its pivotally supported portion, rearwardly of the hook portion. The push-down operating portion 17 projects rearward from the end face of the socket substrate 1.

Figure 7:
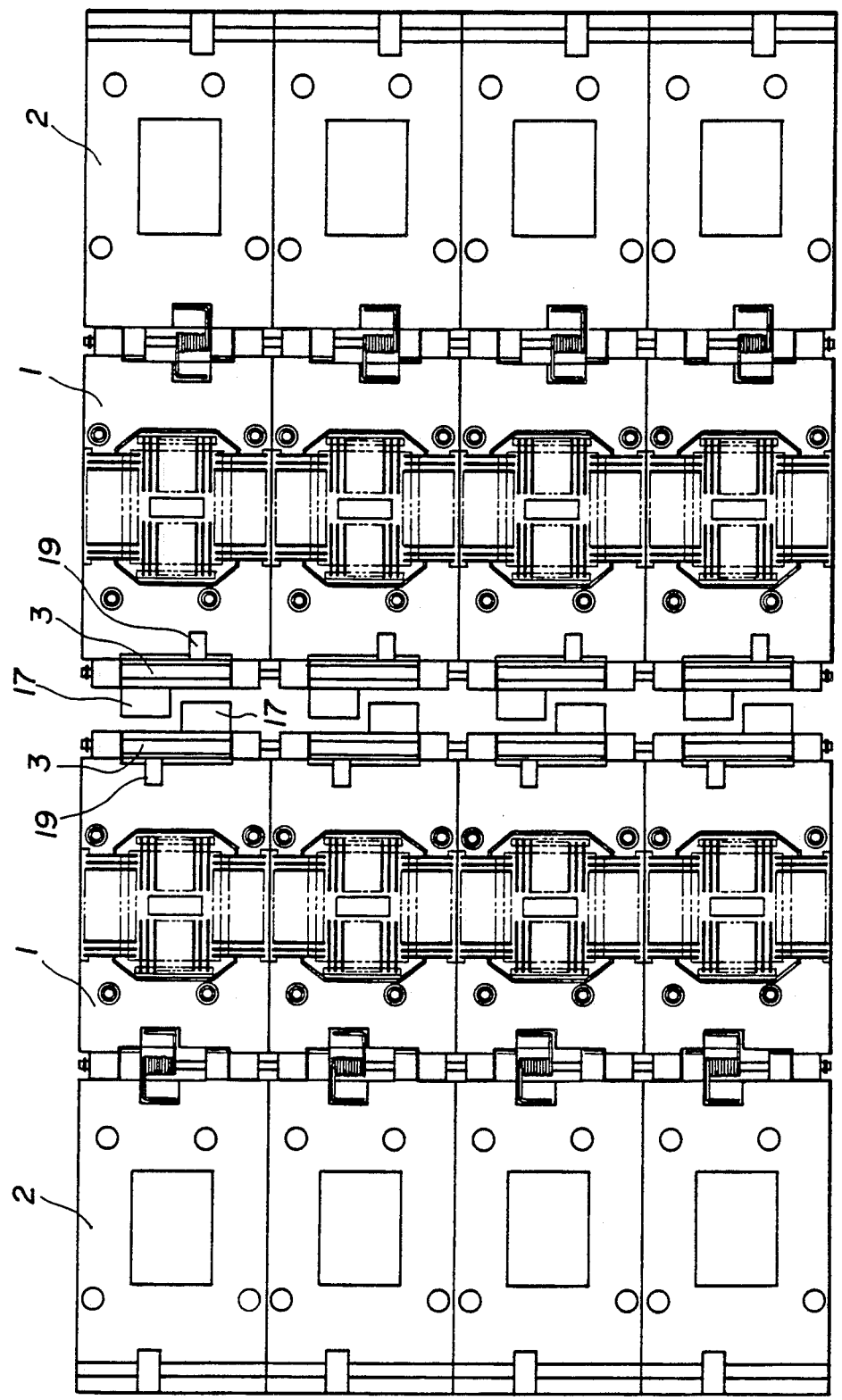
FIG. 7 is a plan view of a plurality of IC sockets arranged in parallel on a wire board.

Owing to the foregoing arrangement, the push-down operating portion 17 and the hook portion 10 form a generally L-shaped lever having the pivotally supported portion of the shaft 8 as its supporting point. And, as described above, the push-down operating portion 17 projects rearwardly of the end face of the socket substrate 1 from the pivotally supported portion. In this case, the push-down operating portion 17, as shown in FIG. 2, is disposed to the right or to the left of a center line perpendicular to the pivotal axis of the lock lever, and projects rearward. By virtue of the foregoing arrangement, as shown in FIG. 7, when a number of IC sockets are arranged in parallel on the wire board, the push-down operating portions 17 of the lock levers 3 of the IC sockets for each row are arranged behind the end faces of the socket substrates 1 in the row adjacent thereto. Moreover, the push-down operating portions 17 for simultaneously pushing down the IC sockets in the adjacent rows are alternately disposed relative to each other. By virtue of the foregoing arrangement, when the robot arm is vertically lowered behind the end faces of the socket substrates, the group of the push-down operating portions 17 are all pushed down at one time. As a result, the group of the hook portions 10 can be pivoted in the backward direction in order to attain their disengagement all at once.

Reference numeral 19 denotes a close preventing stopper for limiting the closing of the lock lever 3 when the IC press cover 2 is opened. The close preventing stopper 19, as shown in FIG. 1, is a knob projecting from the upper surface of the end portion of the socket substrate 1 opposite the front surface of the hook portion 10. The close preventing stopper 19 abuts against the front surface of the hook portion 10 of the lock lever 3, which is biased forwardly in accordance with the force of the spring 9, in order to prevent the lock lever 10 from pivoting forwardly more than a predetermined limit, to thereby maintain a close waiting posture with respect to the IC press cover 2.

Figure 3A:
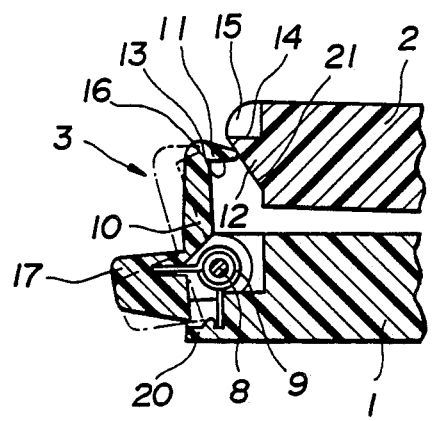
FIGS. 3(A) through 3(C) are sectional views of an important portion of the IC socket, showing the engaging processes of a lock lever.

Also, as shown in FIGS. 1 and 3, reference numeral 20 denotes an open preventing stopper for limiting the opening of the lock lever 3 when disengaged from retaining step portion 12. The open preventing stopper is a knob projecting from a lower edge portion of the socket substrate 1 toward a lower edge of the push-down operating portion 17, the knob abutting against the lower edge of the push-down operating portion 17 as the lock lever 3 is being opened. That is, as shown by the imaginary line in FIG. 3(A), the open preventing stopper 20 abuts against the lower edge of the push-down operating portion 17 of the lock lever 3 which is pivoting rearward against the force of the spring 9 so as to prevent the lock lever 3 from being pivoted rearward more than a predetermined amount, to thereby maintain the hook portion 10 in its completely opened state and to prevent the cover 2 from being snapped down onto the upper surface of the wire board with the socket substrate 1 mounted thereon.

Figure 3B:
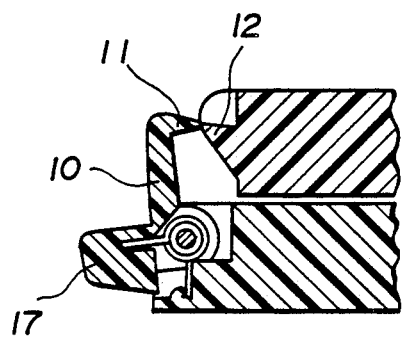
Figure 3C:
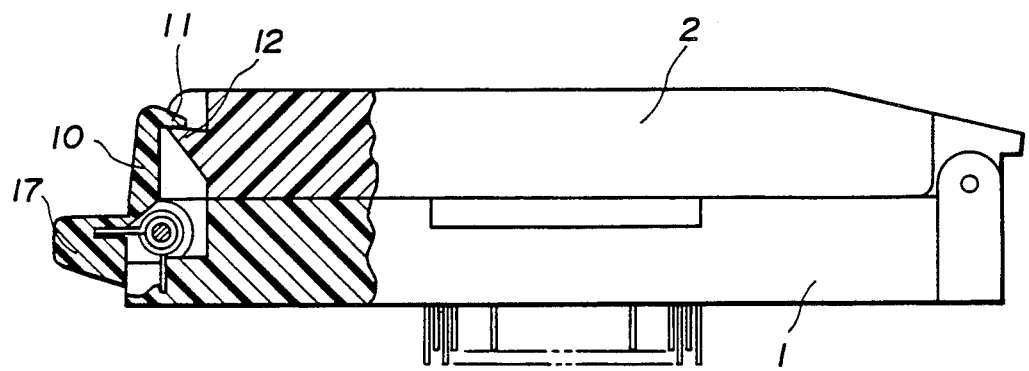
Figure 4:
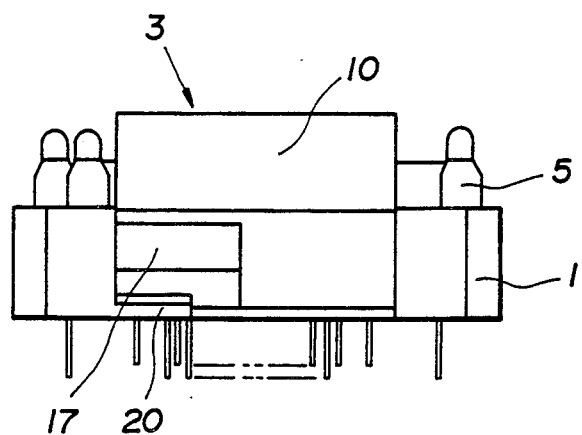
FIG. 4 is a rear view of the IC socket when an IC press cover is opened.
Figure 5:
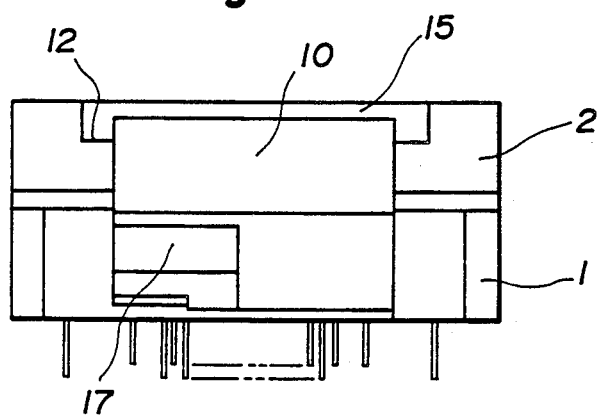
FIG. 5 is a rear view thereof when the IC press cover is closed.

FIGS. 3(A) through 3(C) show processes for bringing the lock lever into engagement with the IC press cover 2. First, as shown in FIG. 3(A), when the IC cover 2 is closed, an inclined surface 21 formed on the lower surface of the retaining step portion 12 abuts against the retaining claw 11 of the hook portion 10 of the lock lever 3 which is in its waiting state and causes the retaining claw 11 to be pivoted rearward along the inclined surface 21 against the force of the spring 9.

As a result, the retaining claw 11, while sliding along the inclined surface 21, climbs over the retaining step portion 12 as shown in FIG. 3(B) and comes into engagement with the inclined engaging surface 14 on the upper surface of the retaining step portion 12 as shown in FIG. 3(C), to thereby maintain the closed state of the IC press cover 2.

Also, as shown by the imaginary line in FIG. 3(A), when the upper surface of the push-down operating portion 17 projecting rearward of the end face of the socket substrates 1 is pushed down against the force of the spring 9, the hook portion is pivoted backward to release the engagement thereof with retaining step portion 12. That is, by lowering the robot arm along the rear surface of the hook portion 10 behind the end face of the socket substrate 1, the push-down operating portion 17 is pushed down. As a result, the above-mentioned engagement can be released. The pushdown operation of the push-down operating portion can be performed by finger.

As a result, the IC press cover 2 is pivoted to a developed position shown in FIG. 1 in accordance with the spring 7 in which the cover is opened. The IC package is loaded and unloaded in that opened state.

Figure 6:
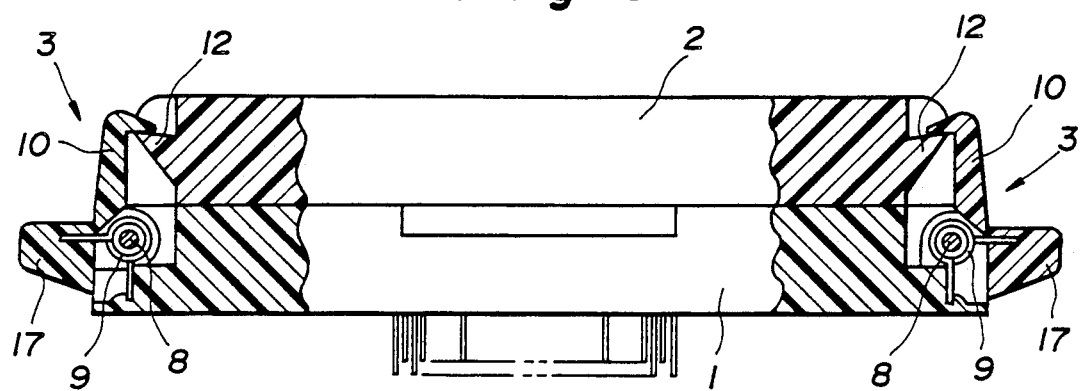
FIG. 6 is a side view, partly in section, another embodiment of an IC socket according to the present invention.

FIG. 6 shows another embodiment. Although in the embodiment of FIGS. 1 through 5, the socket substrate 1 is pivotally attached at one end thereof with the IC press cover 2 and at the other end thereof with the lock lever 3, respectively, in the embodiment shown in FIG. 6, the IC press cover is separate from the socket substrate 1 and each end of the substrate 1 pivotally supports a lock lever 3. When the IC press cover 2 is closed, the hook portion 10 of each lock lever 3 is engaged with the retaining step portion 12 formed at each end of the IC press cover 2, respectively, so as to maintain the closed state of the IC press cover 2. In this case, the structure of the lock lever 3 and the retaining step portion 12 per se is exactly the same as that of the above-mentioned embodiment and a push-down operating portion 17 of the lock lever 3 projects rearward from each end of the socket substrate 1.

As described in the foregoing, according to the present invention, by lowering the robot arm along the rear surface of the hook portion extending from the pivotally supported portion of the lock lever, the push-down operating portion projecting rearward of the end face of the socket substrate is pushed down to pivot the hook portion rearwardly so that the lock lever or the hook portion can be disengaged from the IC press cover. The robot arm can achieve the disengagement by being simply controlled to undergo a vertical reciprocal movement. Therefore, effective automation of the opening and closing of the cover and therefore, of the loading and unloading of the IC package, can be realized.

Furthermore, as the hook portion and the push-down portion form a generally L-shaped lever and the push-down operating portion projects rearward, the engagement and disengagement are effected by a very small force at a portion able to prevent interference with the socket substrate.

Moreover, when a number of IC sockets are arranged in parallel on the wire board, the push-down operating portions are arranged in rows in a state in which the push-down operating portions project rearward of the end faces of the respective socket substrates. By lowering the robot arm on a line extending along the rows of such operating portions so as to press down all of the operating portions, the engaging and disengaging operation can be performed all at one time.

Still further, because the push-down operating portion projects rearward from the pivotally supporting portion of the lock lever, the problem inherent in the prior art resulting from the operating portion projecting upward from the socket substrate can be solved to reduce the density of multistage arrangement of IC sockets on the wire board.

While particular embodiments of the present invention have been shown in the drawings and described above, it will be apparent that many changes may be made in the form, arrangement and positioning of the various elements thereof. Thus, it should be understood that preferred embodiments of this invention disclosed herein are intended to be illustrative only and not intended to limit the scope of the present invention.

We claim:

1. An IC socket comprising:
    a socket substrate having opposed end faces and an upper surface extending between said end faces;
    an IC press cover disposable over the upper surface of said socket substrate;
    at least one lock lever for locking said IC press cover over the upper surface of said IC substrate,
    each said lock lever having a portion thereof pivotally supported by said socket substrate at one of said end faces thereof, a hooked portion extending upwardly from the pivotally supported portion and engageable with and disengageable from an end of said IC press cover when said IC press cover is disposed over the upper surface of said socket substrate, a push-down operating portion extending from the pivotally supported portion in a direction away from and perpendicular to said one of said end faces of the socket substrate, the push-down operating portion pivoting the lock lever at the pivotally supported portion thereof in a first direction in which said hooked portion moves away from the end of said IC press cover to disengage therefrom when said IC press cover is disposed above and over the upper surface of said socket substrate and a downwardly extending force is exerted on the push-down operating portion; and spring means for urging said lock lever to pivot, at the pivotally supported portion thereof, relative to said socket substrate in a second direction in which said hooked portion moves toward the end of said IC press cover to engage therewith when said IC press cover is disposed over the surface of said socket substrate, whereby when said socket substrate is supported on a wire board and said IC press cover is locked in a closed state by an engagement of the hooked portion of said lock lever with the end of said IC press cover, a robot arm can move downwardly onto the push-down operating portion of said lock lever to pivot said lock lever in said first direction thereby disengaging said hooked portion from the end of said IC press cover.

2. An IC socket as claimed in claim 1, wherein said IC press cover has an upper surface that is exposed when the IC cover is disposed over the upper surface of said substrate socket, and said hooked portion terminates at a free end of said lock lever that does not extend beyond the upper surface of said IC press cover.

3. An IC socket as claimed in claim 1, wherein the hooked portion of said lock lever has a free end defining a curved cam surface at a side thereof that faces away from said socket substrate, said cam surface so shaped that when said socket substrate is supported on a wire board and the hooked portion of said lock lever is not completely engaged with the end of said IC cover, a robot arm moving downwardly towards said push-down operating portion will engage said cam surface forcing the hooked portion of said lock lever to completely engage the end of said IC press cover.

4. An IC socket as claimed in claim 1, wherein said lock lever is pivotable, at the pivotally supported portion thereof, relative to said socket substrate about a pivot axis, and said push-down operating portion is entirely disposed to one side of a line passing through the center of said socket substrate perpendicularly to said pivot axis.

* * * * *